United States Patent [19]

Sakashita et al.

[11] Patent Number: 4,677,692
[45] Date of Patent: Jun. 30, 1987

[54] FREQUENCY CONVERSION APPARATUS

[75] Inventors: Seiji Sakashita, Yawata; Takeshi Sato, Hirakata; Hiroyuki Nagai, Ibaraki; Kazuhiko Kubo, Mishima; Akira Usui, Takatsuki, all of Japan

[73] Assignee: Matsushita Electric Industrial Co., Ltd., Osaka, Japan

[21] Appl. No.: 749,416

[22] Filed: Jun. 27, 1985

[30] Foreign Application Priority Data

Jun. 29, 1984 [JP] Japan .................. 59-135634

[51] Int. Cl.⁴ ........................................... H04B 1/26
[52] U.S. Cl. ..................................... 455/319; 455/323; 455/326; 455/333; 455/343
[58] Field of Search ............................. 455/317-319, 455/323, 326, 333, 343

[56] References Cited

U.S. PATENT DOCUMENTS

| | | | |
|---|---|---|---|
| 3,609,556 | 9/1971 | Benson et al. | 455/333 |
| 4,194,158 | 3/1980 | Tanabe et al. | 455/333 |
| 4,344,188 | 8/1982 | Tanabe et al. | 455/333 |
| 4,479,259 | 10/1984 | Fenk | 455/333 |
| 4,480,337 | 10/1984 | Graziadei et al. | 455/333 |

FOREIGN PATENT DOCUMENTS 11687  1/1980  Japan .................. 455/333

OTHER PUBLICATIONS

"GaAs FET Upconverter for TV Tuner", Ulrich Ablassmeier, IEEE Transactions on Electron Devices, vol. ED-27, No. 6, Jun. 1980, pp. 1156-1159.

"A Monolithic GaAs IC for Heterodyne Generation of RF Signals", IEEE Transactions on Electron Devices, vol. ED-28, No. 2, Rory L. Van Tuyl, Feb. 1981, pp. 166-170.

"An Improved High-Performance TV Receiver", Darrell L. Ash, Proceedings of the IEEE, vol. 70, No. 11, Nov. 1982, pp. 1345-1357.

Primary Examiner—Jin F. Ng
Attorney, Agent, or Firm—Wenderoth, Lind & Ponack

[57] ABSTRACT

A frequency conversion apparatus for converting a high frequency signal into an intermediate frequency signal includes a mixer section for mixing a high frequency signal with a local oscillator signal so as to obtain an intermediate frequency signal, and an amplifier connected to the mixer section via a high frequency stopping circuit for supplying a constant direct current to the mixer section as a constant current source. A current flowing in the mixer section when the local oscillator signal is applied is kept substantially equal to a direct current flowing in the mixer section when no local oscillator signal is applied thereto. The amplifier is used for amplifying either the high frequency signal or the intermediate frequency signal, or both signals at the same time.

16 Claims, 19 Drawing Figures

FREQUENCY CONVERSION APPARATUS

BACKGROUND OF THE INVENTION

1. Field of the Invention

The present invention relates to a frequency conversion apparatus which is effectively used for tuners and converters and the like.

2. Description of the Prior Art

In conventional frequency converters, especially one which is operated in switching mode by a local oscillator signal, the current flowing in the main terminals of component transistors suddenly increases by the injection of the local oscillator signal. Therefore, the difference in the operating current is considerable depending on the presence of the local oscillator signal to be injected. Accordingly, it was necessary to operate the frequency converter with a constant current.

Consequently, an amplifier is directly connected to the mixer section to control the increase in the current and this amplifier is used as an amplifier for the high frequency input signal. Such configurations are shown in "GaAs FET up converter for TV tuner" by U. ABLASSMEIER et al, IEEE TRANSACTIONS ON ELECTRON DEVICES, VOL. ED-27, No. 6, June 1980.

With such configurations, however, the amplifier is used only for amplification of the high frequency input signal. On the other hand, because the amplifier and the mixer section are directly connected, it was necessary to design the device while paying attention to the impedance matching therebetween.

SUMMARY OF THE INVENTION

It is an object of the present invention to provide a frequency conversion apparatus which is capable of reducing current consumption and improving conversion gain by using an amplifier as a constant current circuit so as to reduce the current consumption when the local oscillator signal is applied to a mixer.

To achieve the above object, the frequency conversion apparatus of the present invention is so constructed that an amplifier is connected, in terms of direct current, to the high frequency signal input terminal of a mixer via a high frequency signal stopping circuit, so that the mixer and the amplifier are separated from each other with respect to high frequency signals so as to thereby suppress an increase of AC operating current accompanied by an increased local oscillation signal and so that the amplifier is also used as a high frequency input signal amplifier or as an intermediate frequency signal amplifier.

With this configuration, an apparatus of low current consumption can be materialized. Constant and low current are realized by using an amplifier for a constant current circuit so as to output an amplified intermediate frequency signal from the mixer or so as to input an amplified high frequency signal into the mixer. The conversion gain is also improved. The frequency conversion apparatus of the present invention, when connected to other devices to construct a receiver, is effective to improve noise performance and does not considerably deteriorate the interference performance of the mixer. It can also be easily made into an integrated circuit (IC).

DESCRIPTION OF THE PREFERRED EMBODIMENT

Figure 1:
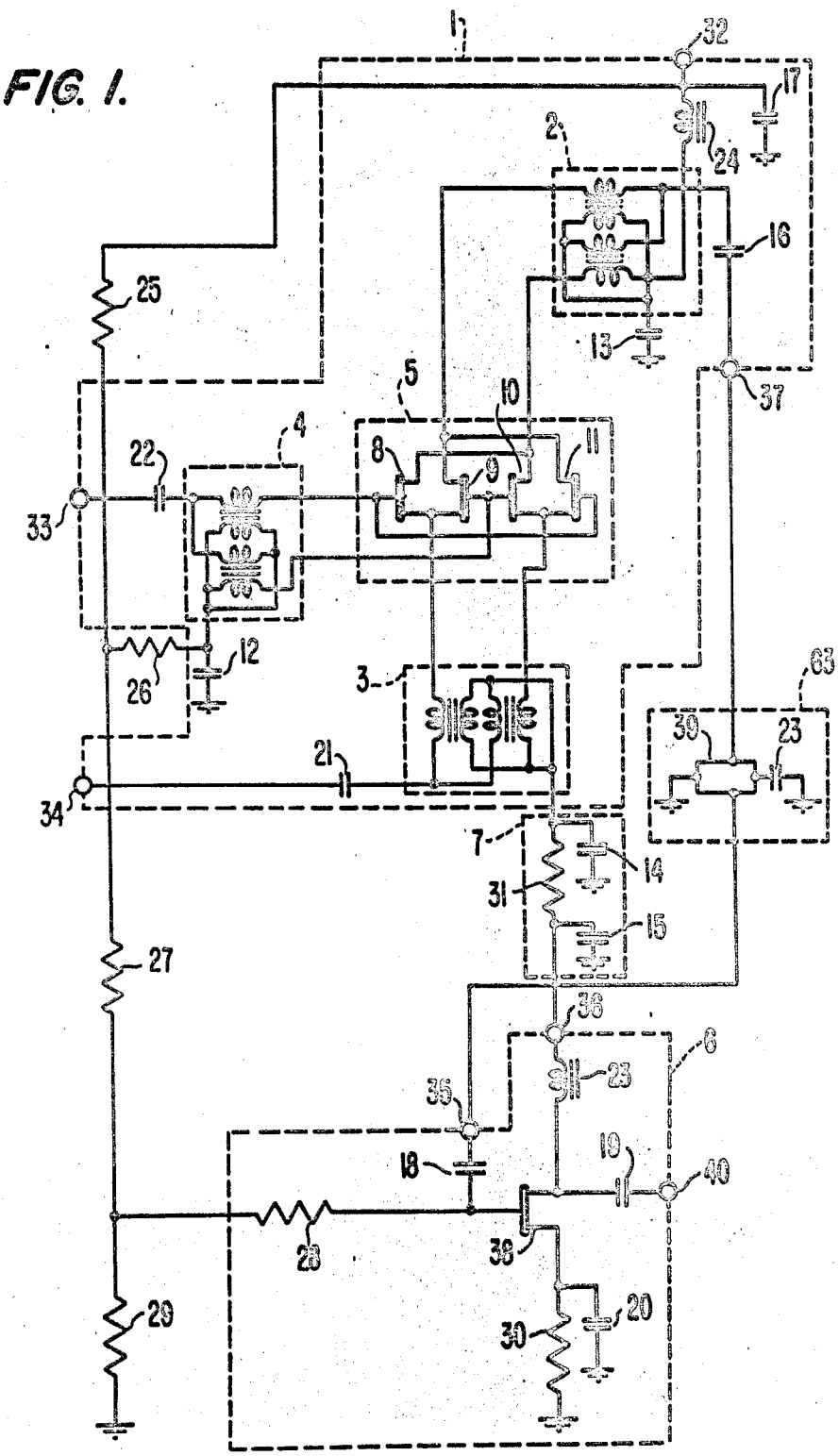
FIG. 1 is a circuit diagram of a frequency conversion apparatus according to a first embodiment of the present invention, wherein an amplifier which operates as a constant current circuit is used as a 1-transistor intermediate frequency output signal amplifier.

In FIG. 1, a mixer 5 is a double-balanced mixer, in which one main terminals of transistors 8 and 9 are connected to each other, one main terminals of transistors 10 and 11 are connected to each other, the other main terminals of transistors 8 and 10 are connected to each other, the other main terminals of transistors 9 and 11 are connected to each other, control terminals of transistors 8 and 11 are connected to each other, and control terminals of transistors 9 and 10 are connected to each other. A local oscillator signal supplied to a local oscillator signal input terminal 33 is converted by an unbalanced-to-balanced converter 4 to two balanced signals, which are applied to control terminals of transistors 8 and 11 and of transistors 9 and 10, respectively.

On the other hand, a high frequency input signal is inputted from a high frequency signal input terminal 34, flows through a DC blocking capacitor 21, and enters the balanced-to-unbalanced converter 3, wherein the high frequency input signal is converted to two balanced signals, which are supplied to the one main terminals of transistors 8 and 11 and of transistors 9 and 10, respectively. The mixer 5 intermittently causes a current to flow through the main terminals by means of the local oscillator signal applied to the control terminals and also intermittently causes the high frequency input signal to be applied to one of the main terminals, thereby mixing the frequency. As a result of this, balanced intermediate frequency signals appear at the other main terminals, of transistors 8 and 10 and of transistors 9 and 11, respectively. The intermediate frequency signals are converted by a balanced-to-unbalanced converter 2 to an unbalanced signal, which is outputted from an intermediate frequency signal output terminal 37 via a DC blocking capacitor 16.

The intermediate frequency signal appearing at intermediate frequency output terminal 37 is applied to a parallel resonator 63 composed of a tuning line 39 and a capacitor 23. The resonance frequency of the parallel resonator 63 is set to the intermediate frequency, so that the parallel resonator 63 acts as an intermediate frequency filter. By changing the position to input the signal into or the position to take out the signal from the tuning line 39, the input and output impedance of the intermediate frequency filter 63 can be changed. In this embodiment, a tuning line and a capacitor are used to configure the intermediate frequency filter 63, but any means which causes resonance may be used such as SAW filter, dielectric filter a crystal filter.

The intermediate frequency signal passed through the intermediate frequency filter 63 enters into an input terminal 35 of an amplifier 6. The power supply terminal 36 of amplifier 6 is connected to one of the unbalanced side terminals of unbalanced-to-balanced converter 3 via a high frequency signal blocking circuit 7. Therefore, the overall direct current flowing through the main terminals of mixer 5 flow in this amplifier 6. A voltage is applied to a control terminal of transistor 38 which configures amplifier 6 to cause a direct current to flow through the main terminal of transistor 38, the direct current being is determined by the current characteristic of transistor 38 and a resistor 30. Thus, this direct current is equal to the overall direct current of mixer section 1. The potential difference between the control terminal of transistor 38 and the main terminal of transistor 38 connected to a grounded terminal via the resistor 30, i.e., the bias voltage, is fixed externally; however, the bias voltage of mixer 5 becomes a voltage corresponding to the overall direct current flowing through amplifier 6. In other words, this overall direct current is dominated by the current of amplifier 6.

Therefore, the amplifier 6 operates as a constant current source unless it is not a large signal amplifier. If the main electrodes of transistors 8, 9, 10 and 11 are intermittently conduct by the local oscillator signal, the mixer section 1 operates at the constant current by the constant current operation of amplifier 6, so that the operating current is not increased by the injection of the local oscillator signal. The intermediate frequency signal applied to the control terminal of transistor 38 via a DC blocking capacitor 18 is amplified by transistor 38 and taken out from one main terminal of transistor 38 connected to the power supply terminal 36 via a choke coil 23.

The other main terminal of transistor 38 is grounded for high frequency via a capacitor 20. The intermediate frequency signal taken out from the one main terminal of transistor 38 passes through a DC blocking capacitor 19, and is taken out from an output terminal 40 to be supplied to a circuit in the next stage.

To prevent intermixing between the high frequency input signal supplied from high frequency signal input terminal 34 to mixer 5 via unbalanced-to-balanced converter 3 and the intermediate frequency signal appearing in choke coil 23 of amplifier 6, the high frequency signal stopping circuit 7 is connected between the balanced-to-unbalanced converter 3 and the current terminal 36 of amplifier 6. Since the high frequency input signal and the intermediate frequency signal are sufficiently attenuated by means of capacitors 14, 15 and a resistor 31, the balanced-to-unbalanced transducer 3 and amplifier 6 are completely separated from each other with respect to high frequency. Therefore, mixer section 1 and amplifier 6 are independent of each other for high frequency signals, allowing only a direct current to flow through both mixer section 1 and amplifier 6 via the resistor 31. Power is supplied to mixer section 1 from a power supply terminal 32 via a choke coil 24. The bias voltages of the control terminals of transistors 8, 9, 10 and 11 in mixer section 1 and the control terminal of transistor 38 in amplifier 6 are respectively obtained by dividing the power source voltage by resistors 25, 27 and 29. That is, the bias voltages are applied from the connecting point of resistors 25 and 27 to the control terminals of transistors 8, 9, 10 and 11 via a resistor 26, and from the connecting point of resistors 27 and 29 to the control terminal of transistor 38 via a resistor 28, respectively.

The bias voltages are determined so that the conversion loss at the mixer section becomes minimum and the gain and distortion characteristics of the amplifier become optimum.

As above, with this embodiment according to the present invention, a considerable increase in AC operating current when the local oscillator signal is fed to the mixer section can be suppressed by operating the amplifier as a constant current circuit. Furthermore, since the operating current is shared by the mixer section and amplifier, the current consumption of the overall frequency conversion apparatus can be reduced, and the conversion gain of the frequency conversion apparatus can be improved by amplifying the intermediate frequency signal by the amplifier. Moreover, when the frequency conversion apparatus of the present invention is connected to other devices to configure a receiver, the effect of noise characteristics of the following stages can be suppressed, resulting in the reduced noise figure of the receiver.

Another embodiment based on the first embodiment according to the present invention will now be explained with reference to FIG. 2.

Figure 2:
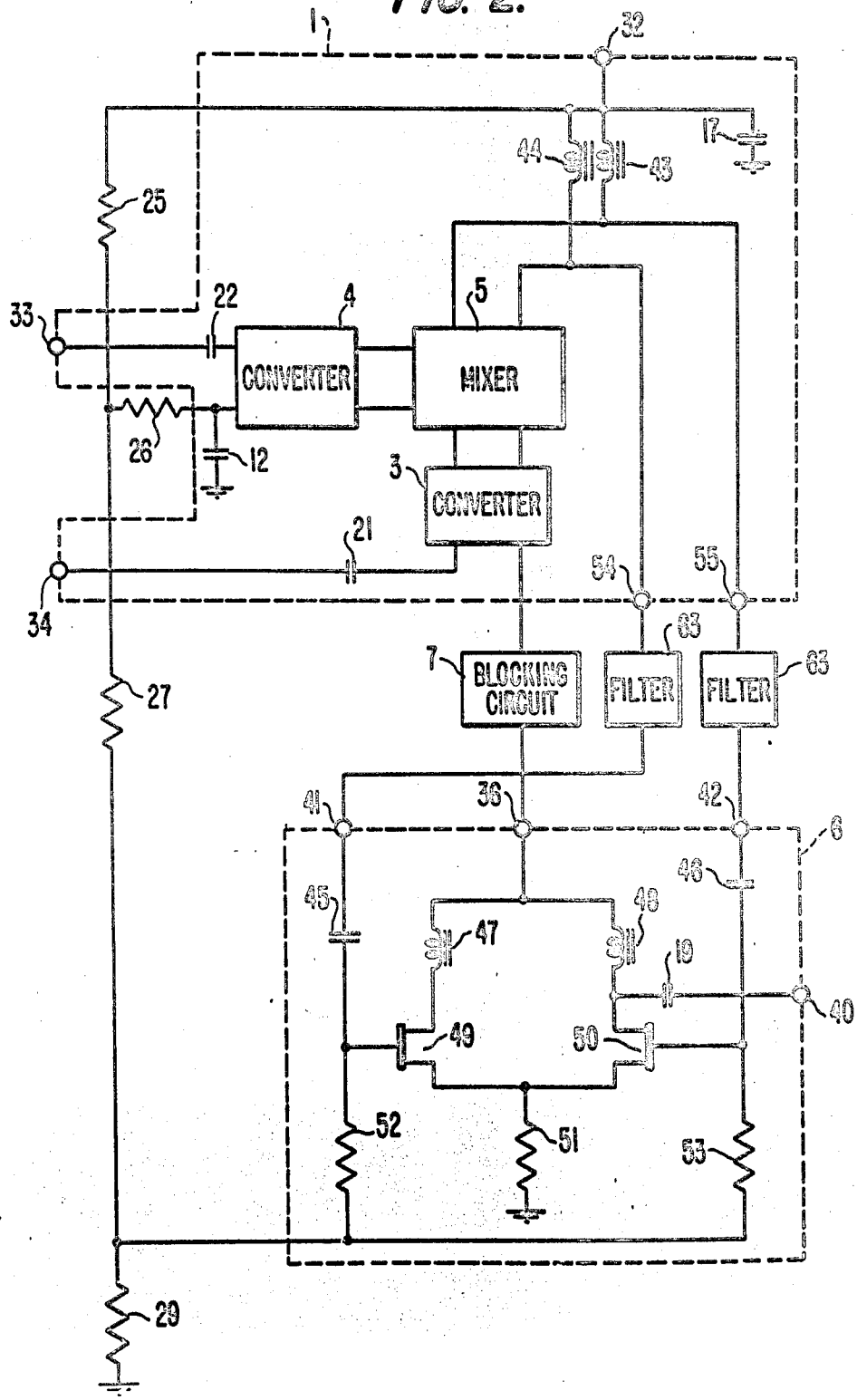
FIG. 2 is a circuit diagram of a frequency conversion apparatus according to the first embodiment wherein the amplifier which operates as a constant current circuit is used as a 2-transistor intermediate frequency output signal amplifier.

In FIG. 2, detailed descriptions of unbalanced-to-balanced converters 3, 4 and mixer 5 are omitted because their configurations and operations are identical with those in FIG. 1. The intermediate frequency signals obtained by mixer 5, which are balanced signals, are taken out from intermediate frequency signal output terminals 54 and 55.

Main terminals of the transistors composing mixer 5 are connected to the power supply terminal 32 via choke coils 43 and 44, respectively. The intermediate frequency signals taken out from the intermediate frequency signal output terminals 54 and 55 enter the input terminals 41 and 42 of the amplifier 6 via intermediate frequency filters 63, respectively. The intermediate frequency signal that entered through the input terminal 41 is supplied to a control terminal of a transistor 49 via a DC blocking capacitor 45. The intermediate frequency signal that entered from the input terminal 42 is supplied to a control of a transistor 50 via a DC stopping capacitor 46. Here, the intermediate frequency signals may be directly supplied from intermediate frequency signal output terminals 54 and 55 to input terminals 41 and 42. One main terminals of transistors 49 and 50 are interconnected to each other and also to the ground via a resistor 51. The other main terminals of transistors 49 and 50 are connected to a power supply terminal 36 via choke coils 47 and 48, respectively.

Therefore, the amplifier 6 is a differential amplifier comprising transistors 49 and 50 and resistor 51. The intermediate frequency signals that entered respective control electrodes of transistors 49 and 50 are amplified there and appear at the main terminals at the power source side of transistors 49 and 50, respectively. Since amplifier 6 is symmetrically configured, the intermediate frequency signal may be taken out from either of the main terminals of transistor 49 and 50.

In FIG. 2, the intermediate frequency signal is taken out from the main terminal of transistor 50, and outputted from an output terminal 40 via a DC blocking capacitor 19. It is not particularly necessary to take out the signal from either of the transistors 49 and 50, but signals may be taken out from both the transistors and supplied to the next stage as balanced signals. The power supply terminal 36 is connected to the unbalanced-to-balanced converter 3 via high frequency signal blocking circuit 7 so that the current flowing through mixer section 1 passes through the high frequency signal blocking circuit 7 with the high frequency signal sufficiently attenuated and is fed to amplifier 6. Therefore, the sum of the currents flowing through the main terminals of transistors 49 and 50 is the very current of mixer section 1. The bias voltages of the transistors 49 and 50 are determined so that the conversion loss of the mixer section 1 becomes minimum and the gain and distortion characteristics of the amplifier 6 become optimum. The bias voltages are supplied from the connecting point of resistors 27 and 29 to the control terminals of transistors 49 and 50 via resistors 52 and 53, respectively.

As described above, with this embodiment, since a balanced-to-unbalanced converter is not connected to the output of the mixer section, but the output of the mixer section is connected to the amplifier only via the intermediate frequency filter and DC blocking capacitor, it is advantageous for integrating the mixer section and the amplifier on a single semiconductor substrate.

Now, still another embodiment based on the first embodiment according to the present invention will be explained with reference to FIG. 3.

Figure 3:
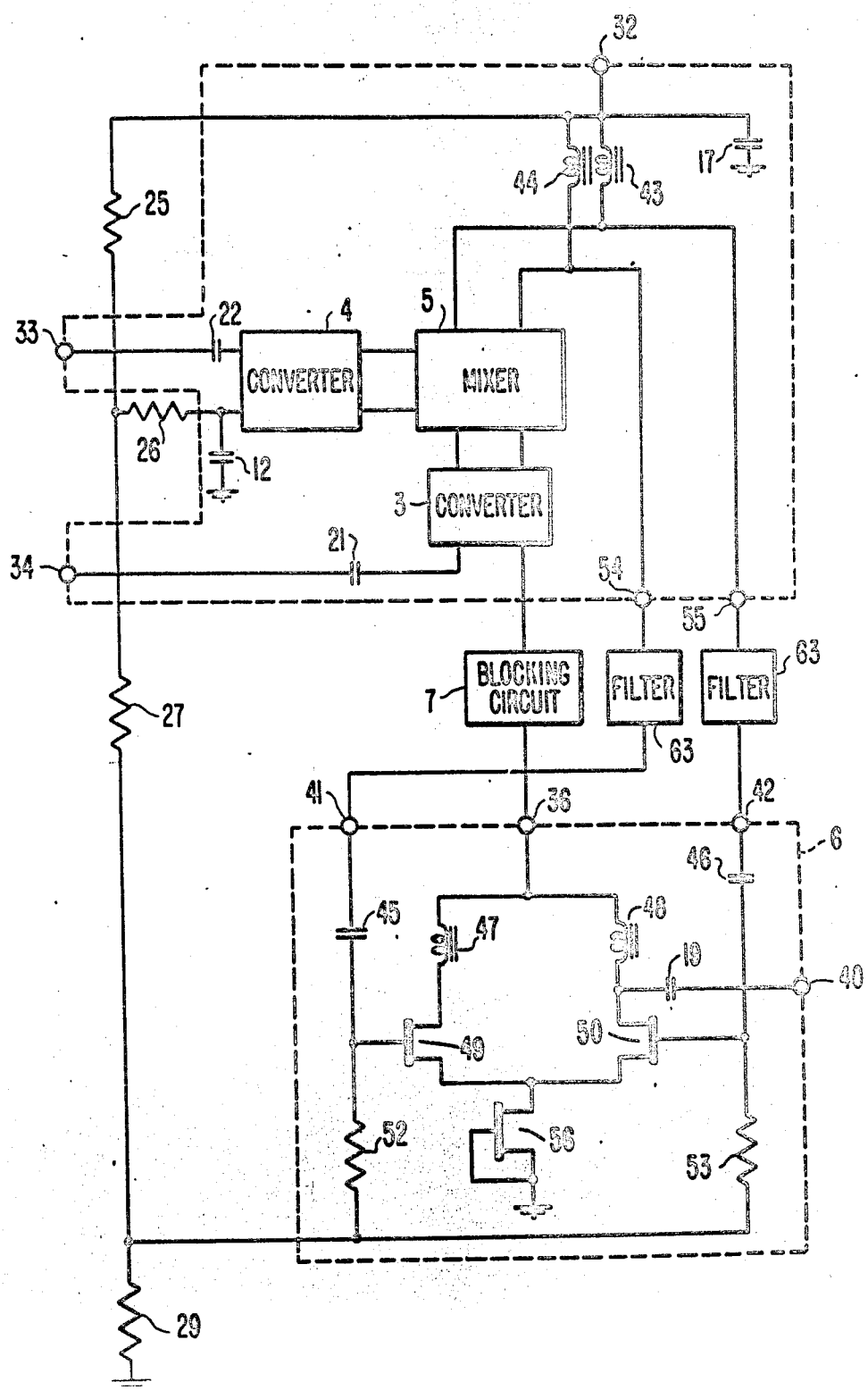
FIG. 3 is a circuit diagram of a frequency conversion apparatus according to the first embodiment wherein the amplifier which operates as a constant current circuit is used as a 3-transistor intermediate frequency output signal amplifier.

In FIG. 3, detailed description of unbalanced-to-balanced converters 3, 4 and mixer 5 are omitted because they are constructed and operate in the same way as described in the case of FIG. 1. The intermediate frequency signals obtained by mixer 5, which are balanced signals, are taken out from intermediate frequency signal output terminals 54 and 55.

Main terminals of the transistors composing mixer 5 are connected to power supply terminal 32 via choke coils 43 and 44, respectively. The intermediate frequency signals from intermediate frequency signal output terminals 54 and 55 enter the input terminals 41 and 42 of amplifier 6 via intermediate frequency filters 63, respectively. The intermediate frequency signal that entered through input terminal 41 is supplied to the control terminal of transistor 49 via DC blocking capacitor 45, and the intermediate frequency signal that entered through input terminal 42 is supplied to the control terminal of transistor 50 via DC blocking capacitor 46. Here, the intermediate frequency signals may be directly supplied from intermediate frequency signal output terminals 54 and 55 to input terminals 41 and 42, respectively.

Main terminals of transistors 49 and 50 are interconnected to each other and further to the ground via a transistor 56. The transistor 56 may be either an enhancement type transistor or a depletion type transistor. The other main terminals of transistors 49 and 50 are connected to power supply terminal 36 via choke coils 47 and 48, respectively.

Therefore, the amplifier 6 is a differential amplifier comprising transistors 49, 50 and 56. The intermediate frequency signals that entered respective control terminals of transistors 49 and 50 are amplified there and appear at the main terminals at the power source side of transistors 49 and 50. Since the amplifier is configured so as to be symmetrical, the intermediate frequency signal is taken from either of the main terminals of transistors 49 and 50. The intermediate frequency signal is outputted from the output terminal 40 via DC blocking capacitor 19. The balanced intermediate frequency signals from both the transistors 49 and 50 may be supplied to the circuit in the next stage. The power supply terminal 36 is connected to the unbalanced-to-balanced converter 3 via high frequency signal blocking circuit 7 so that the current flowing through the mixer section 1 passes through the high frequency signal blocking circuit 7 with to the high frequency signal sufficiently attenuated and enters amplifier 6. Therefore, the sum of the currents flowing through the main terminals of transistors 49 and 50 is the current flowing through transistor 56 or the very current of mixer section 1.

The operating current of transistor 56 is determined so that the conversion loss of mixer section 1 becomes minimum and the gain and distortion characteristics of amplifier 6 are optimum. Since the static characteristic of transistor 56 is utilized by connecting the control terminal with one main terminal to be a constant current circuit, the operating current value is set by changing the static characteristic of transistor 56. This feature is advantageous, in addition to the features of the FIG. 2 embodiment, for integrating the mixer section and the amplifier on a single semiconductor substrate.

Next, second embodiment of the present invention will be described.

Figure 4:
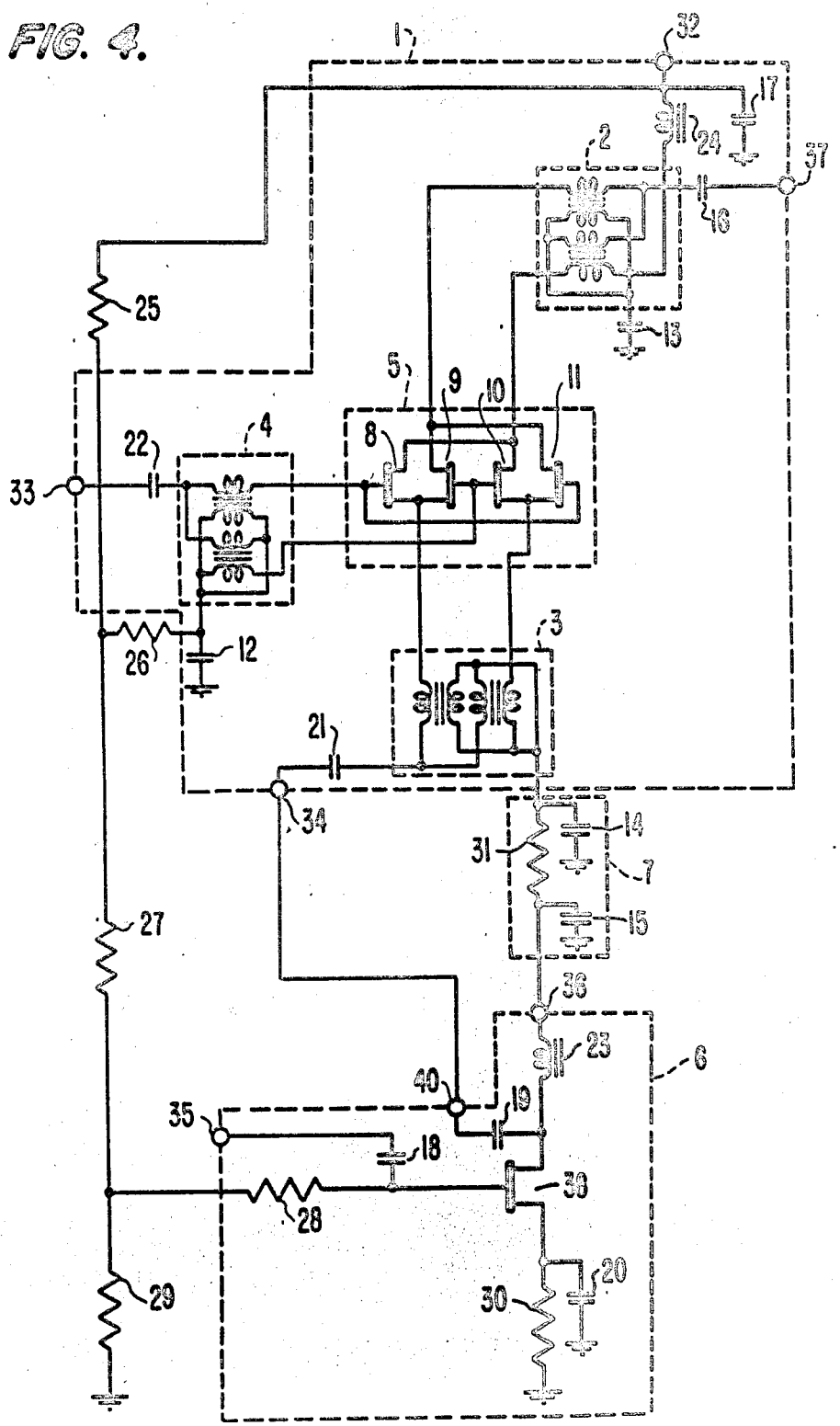
FIG. 4 is a circuit diagram of a frequency conversion apparatus according to a second embodiment of the present invention, wherein the amplifier which operates as a constant current circuit is used a 1-transistor high frequency input signal amplifier.

Referring to FIG. 4, mixer 5 is a double balanced mixer which is so constructed that main terminals of transistors 8 and 9 are connected to each other and main terminals of transistors 10 and 11 are connected to each other; the other main terminals of transistors 8 and 10 are connected to each other, the other and main terminals of transistors 9 and 11 are connected to each other; the control terminals of transistors 8 and 11 are connected to each other, and the control terminals of transistors 9 and 10 are connected to each other. A local oscillator signal inputted to local oscillator signal input terminal 33 is converted by unbalanced-to-balanced converter 4 to two balanced signals, which are applied to the two interconnected control terminals of mixer 5, respectively.

On the other hand, a high frequency input signal is supplied to input terminal 35 of amplifier 6, and then to the control terminal of transistor 38 in amplifier 6 via DC blocking capacitor 18. The high frequency input signal is amplified by transistor 38, and taken out from the main terminal connected to power supply terminal 36 via choke coil 23, and applied to output terminal 40 via DC blocking capacitor 19. The operating current of transistor 38 is determined by a bias voltage applied to the control terminal via resistor 28, resistor 30 and the static characteristic of transistor 38. Capacitor 20 is used for grounding the high frequency signal. The high frequency input signal appearing at output terminal 40 enters into high frequency signal input terminal 34 of mixer section 1, and is applied to unbalanced-to-balanced converter 3 via DC blocking capacitor 21 to be converted into two balanced signals, which are fed to mixer 5.

The local oscillator signal and the high frequency signal are mixed by mixer 5, thereby producing two balanced intermediate frequency signals. The balanced intermediate frequency signals appear at the main terminals of transistors 8 and 10 and of transistors 9 and 11, respectively, which are connected to power supply terminal 32 via balanced-to-unbalanced converter 2 and choke coil 24.

The balanced intermediate frequency signals are converted by balanced-to-unbalanced converter 2 into an unbalanced signal, which is applied to intermediate frequency signal output terminal 37 via DC blocking capacitor 16, and further to the next stage.

Here, power supply terminal 36 of amplifier 6 is connected to balanced-to-unbalanced converter 3 via high frequency signal blocking circuit 7, and the direct current flowing through mixer 5 passes through high frequency signal blocking circuit 7 and flows into amplifier 6. The high frequency blocking circuit 7 sufficiently attenuates the high frequency signal by grounding capacitors 14 and 15, and controls voltage distribution to each transistor by resistor 31. The operating current value is determined in such a manner, as in the case of the first embodiment, that the conversion loss of mixer section 1 becomes minimum and the gain and distortion characteristics of amplifier 6 become optimum. The bias voltages are supplied by dividing the power source voltage by resistors 25, 27 and 29, from the connecting point of resistors 25 and 27 to the control terminals of transistors 8, 9, 10 and 11 mixer 5 via resistor 26, and from the connecting point of resistors 27 and 29 to the control terminal of transistor 38 in amplifier 6 via resistor 28.

In this embodiment, output terminal 40 of amplifier 6 and high frequency signal input terminal 34 of mixer section, are directly connected, but they may be connected via a matching circuit when their impedances are different from each other.

As described above, by the second embodiment according to the present invention, a considerable increase in AC operating current when the local oscillation signal is injected into the mixer section can be suppressed by operating the amplifier as the constant current circuit. Further, since the same operating current is shared by the mixer section and the amplifier and the amplifier operates as a pre-amplifier of the mixer section, it becomes possible to improve the conversion gain of the frequency conversion apparatus and to suppress the influence of noise performance, thereby materializing the reduced noise figure of the overall apparatus.

Figure 5:
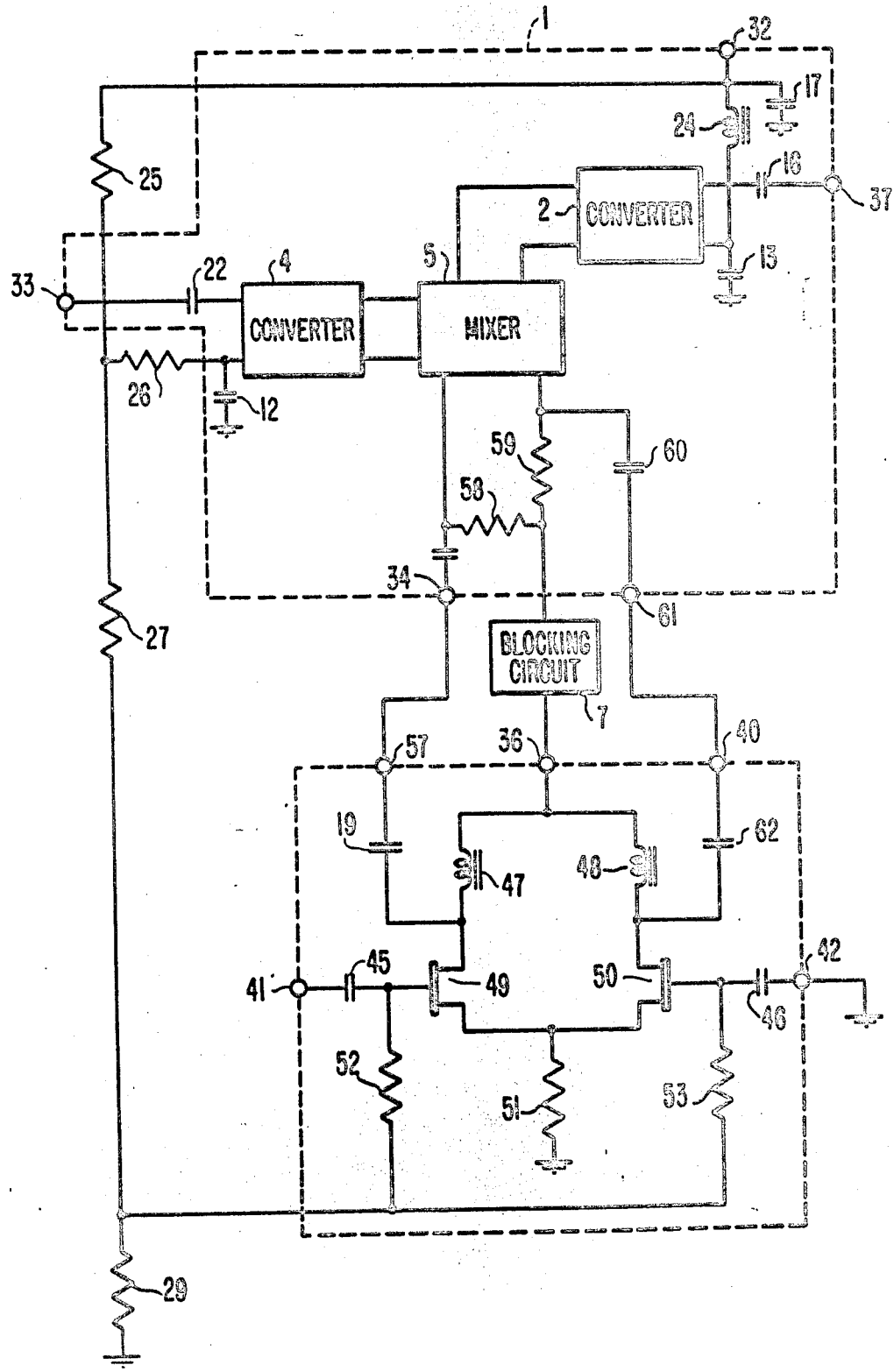
FIG. 5 is a circuit diagram of a frequency conversion apparatus according to the second embodiment wherein the amplifier which operates as a constant current circuit is used as a 2-transistor high frequency input signal amplifier.

Another embodiment based on the second embodiment according to the present invention will hereafter be explained by referring to FIG. 5.

In FIG. 5, detailed descriptions of balanced-to-unbalanced and unbalanced-to-balanced converters 2, 4 and mixer 5 are omitted because their configurations and operations are identical with those in FIG. 4. The high frequency input signal is supplied to input terminal 41 of amplifier 6, and further to the control terminal of transistor 49 via DC blocking capacitor 45. On the other hand, the control terminal of transistor 50 is grounded via DC blocking capacitor 46.

Main terminals of transistors 49 and 50 are interconnected, and resistor 51 is connected between the interconnecting point and the ground. The other main terminals of transistors 49 and 50 are connected to power supply terminal 36 via choke coils 47 and 48, respectively. Therefore, amplifier 6 is a differential amplifier comprising transistors 49 and 50 and resistor 51. The high frequency input signal which is supplied to the control terminal of transistor 49 from input terminal 41 and accordingly appears also at the control terminal of transistors 50 is amplified, and appear at each of the main terminals at the power source side of transistors 49 and 50. The high frequency input signals appearing at the main terminals of transistors 49 and 50 are balanced signals, which are then outputted from output terminal 57 via DC blocking capacitor 19 and from output terminal 40 via DC blocking capacitor 62, respectively.

The power source terminal 36 is connected to via high frequency signal stopping circuit 7 to the other main terminals of the transistors composing mixer 5 via resistors 58 and 59, respectively. The direct current flowing through mixer section 1 passes through the high frequency signal stopping circuit 7 so that the high frequency signal is sufficiently attenuated and enters into amplifier 6. Therefore, the sum of the currents flowing through main terminals of transistors 49 and 50 is the very current of mixer section 1. The bias voltages of transistors 49 and 50 are determined so that the conversion loss of mixer section 1 becomes minimum and the gain and distortion characteristics of amplifier 6 become optimum. The bias voltages are supplied from the connecting point of resistors 27 and 29 to the control terminals of transistors 49 and 50 via resistors 52 and 53, respectively.

Figure 6:
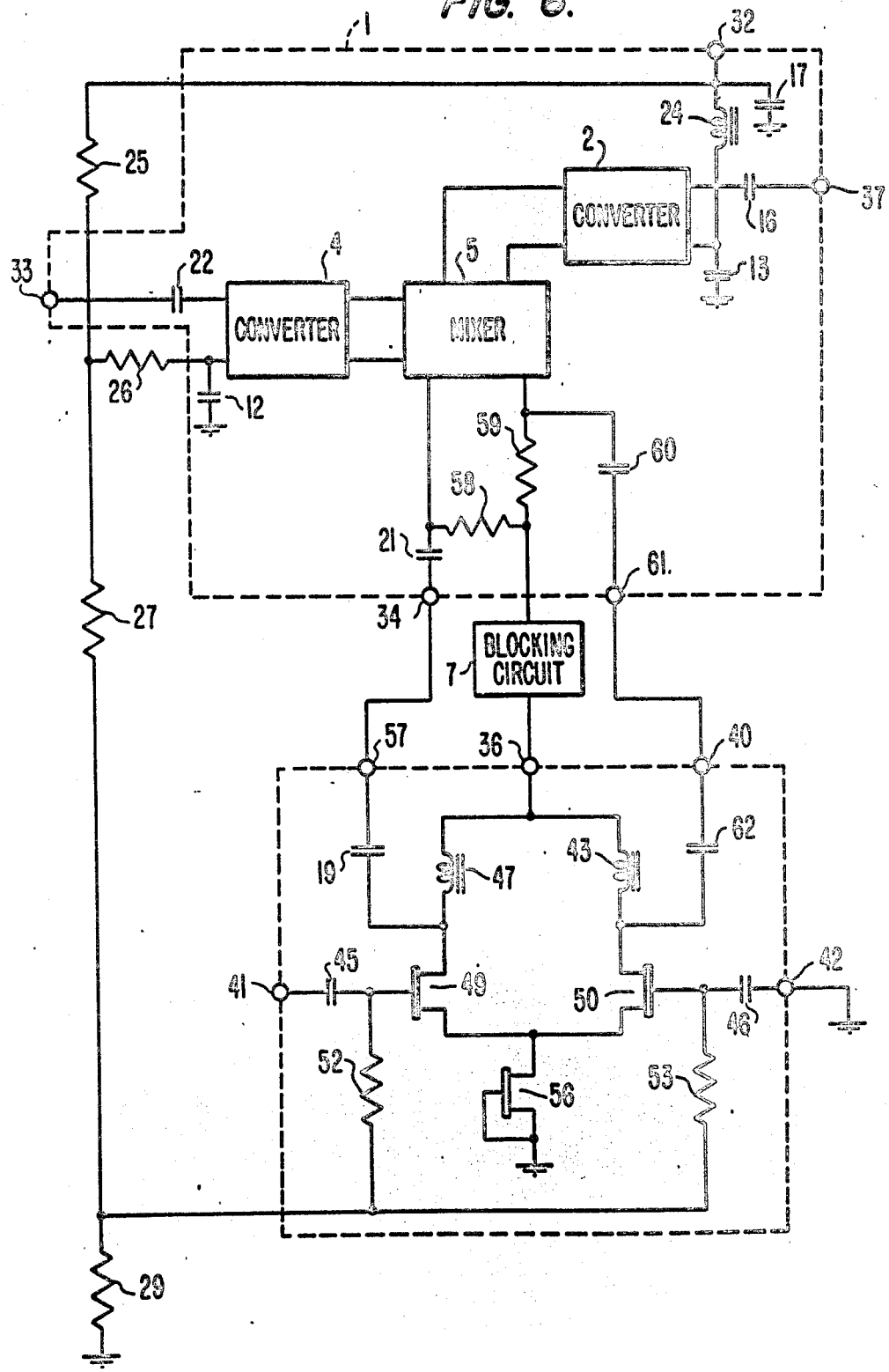
FIG. 6 is a circuit diagram of a frequency conversion apparatus according to the second embodiment, wherein the amplifier which operates as a constant current circuit is used as a 3-transistor high frequency input signal amplifier.

As described above, since any balanced-to-unbalanced converter is not connected to the input of the mixer section but the mixer section is connected to the amplifier only via a DC blocking capacitor, it is advantageous for integrating the mixer section and the amplifier on a single semiconductor substrate The resistor 51 in amplifier 6 may be replaced by a transistor. Such a modification is shown in FIG. 6. Referring to FIG. 6, a transistor 56 connecting one main terminal with the control terminal is connected between the connecting point of the main terminals of transistors 49 and 50 and the ground. The transistor 56 may be either an enhancement tube transistor or a depletion type transistor.

A third embodiment according to the present invention will now be explained by referring to the drawing.

Figure 7:
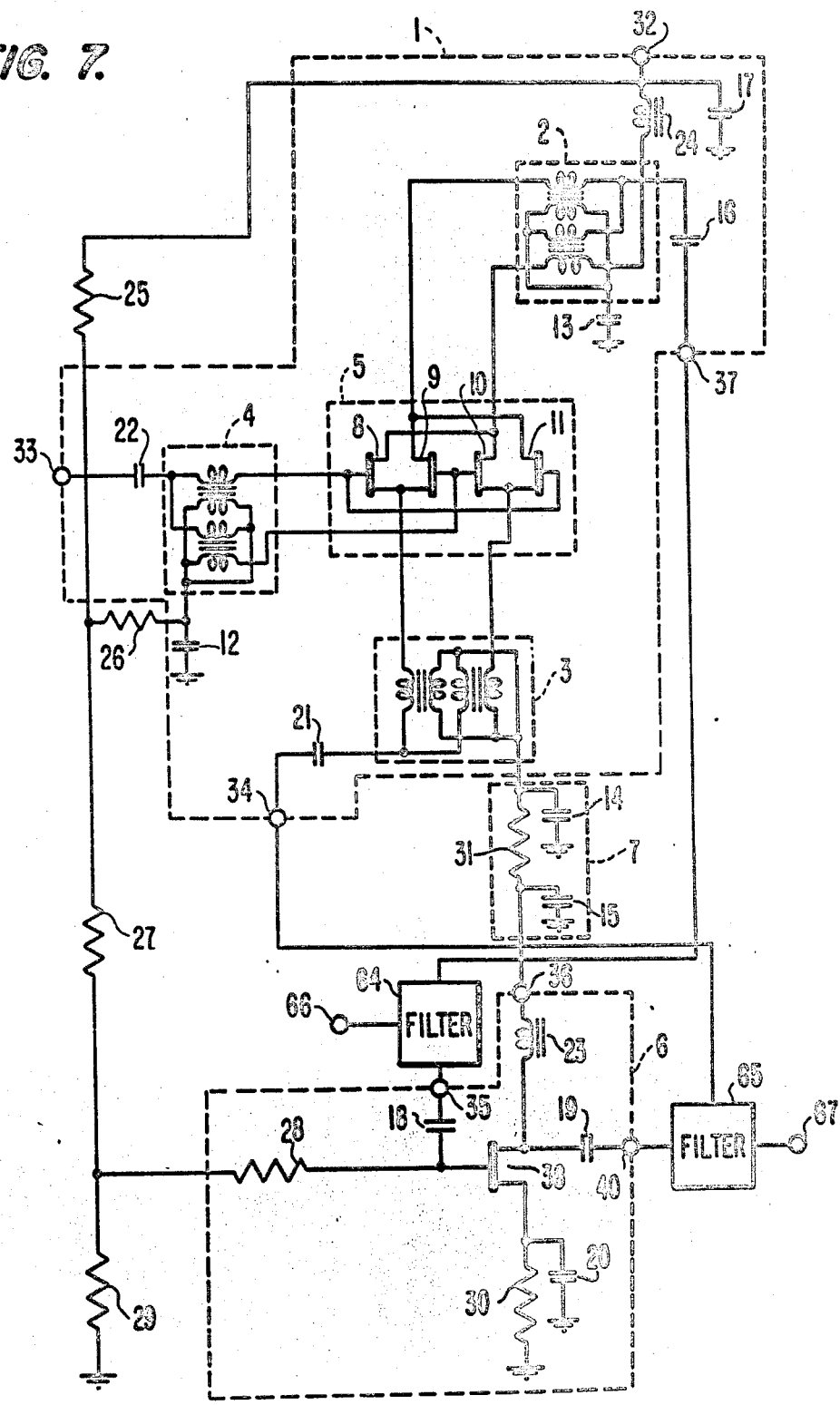
FIG. 7 is a circuit diagram of a frequency conversion apparatus according to a third embodiment of the present invention, wherein an amplifier operates as a constant current circuit is used as a 1-transistor high frequency input signal and intermediate frequency output signal amplifier.

In FIG. 7 mixer 5 is a double balanced mixer comprising transistors 8, 9, and 10 and 11 which are connected in the same way as described in the foregoing embodiments. A local oscillator signal inputted to local oscillator signal input terminal 33 passes through DC blocking capacitor 22, and converted by unbalanced-to-balanced converter 4 into two balanced local oscillation signals. The two balanced local oscillation signals are fed to the control terminals of transistors 8 and 11 and of transistors 9 and 10, respectively. At the main terminals of transistors 9 and 11 and of transistors 8 and 10 appear two balanced intermediate frequency signals, respectively, which are obtained by mixing the balanced local oscillator signals with the balanced high frequency signals fed to the other main terminals of transistors 8 and 9 and of transistors 10 and 11, respectively, as described before. The balanced intermediate frequency signals are converted by balanced-to-unbalanced converter 2 into an intermediate frequency signal, which is fed to an input terminal of an input filter 64 via DC blocking capacitor 16 and output terminal 37 of mixer section 1.

On the other hand, a high frequency input signal inputted to a high frequency signal input terminal 66 is fed to the other input terminal of input filter 64. The high frequency input signal and the intermedite frequency signal are combined at input filter 64 to be combined signal.

The combined signal is inputted to input terminal 35 of amplifier 6 and supplied to the control terminal of transistor 38 via DC blocking capacitor 18.

The combined signal amplified by transistor 38, taken out from the main terminal of transistor 38 connected to power supply terminal 36 via choke coil 23, and passes through DC blocking capacitor 19 to be outputted from output terminal 40. The outputted combined signal is separated into a high frequency signal and an intermediate frequency signal by an output filter 65. The intermediate frequency signal is supplied to the next stage through a terminal 67.

On the other hand, the high frequency signal is supplied to high frequency signal input terminal 34 of mixer section 1. The high frequency signal then passes DC blocking capacitor 21, and enters into unbalanced-to-balanced converter 3 to be converted into the balanced high frequency signals, which are applied to mixer 5.

The input filter 64 is a well-known filter is which the two input terminals for high frequency and intermediate frequency signals are adequately isolated from each other. Also, the output filter 65 is a well-known filter in which the two output terminals for high frequency and intermediate frequency signals are adequately isolated from each other. Accordingly, description as to specific circuit configurations of filters 64 and 65 is omitted here.

In view of the above, amplifier 6 acts as both a high frequency input signal amplifier and an intermediate frequency signal amplifier at the same time.

The power source terminal 36 of amplifier 6 is connected to one of the unbalanced side terminals of balanced-to-unbalanced converter 3 via high frequency signal stopping circuit 7. Therefore, the overall direct current flowing through the main terminals of mixer 5 flows through amplifier 6. A voltage is applied to the control terminal of transistor 38 so as to cause a DC current to flow through the main terminals of transistor 38, the DC current being determined by resistor 30 and the current characteristic of transistor 38. Thus, this direct current is equal to the overall direct current of mixer section 1. The potential difference between the control terminal of transistor 38 and the main terminal of the same connected to the grounded via resistor 30, i.e., the bias voltage of transistor 38, is fixed externally. However, the bias voltage of mixer 5 is a voltage corresponding to the overall direct current flowing through the amplifier 6. In other words, the overall direct current is dominated by the current of amplifier 6. Therefore, amplifier 6 operates as a constant current circuit as long as amplifier 6 is not a large signal amplifier. Although the main terminals of transistors 8, 9, 10 and 11 in mixer 5 conduct intermittently by the local oscillation signal, mixer section 1 is subjected to a constant current operation by the constant current operation of amplifier 6, so that the operating current is not increased by the injection of the local oscillation signal.

To prevent interference between the high frequency input signal to be supplied to mixer 5 and the combined signal of high frequency input signal and intermediate frequency signal appearing in choke coil 23, a high frequency signal blocking circuit 7 is connected between unbalanced-to-balanced converter 3 and power supply terminal 36 of amplifier 6, causing to a sufficiently attenuation the combined signal consisting of the high frequency input signal and intermediate frequency signal by means of capacitors 14, 15 and resistor 31, thereby dividing completely unbalanced-to-balanced converter 3 and amplifier 6 with respect to high frequency. Therefore, mixer section 1 and amplifier 6 are independent of each other with respect to the high frequency signal, allowing only the direct current to flow through both mixer section 1 and amplifier 6 via resistor 31.

Power is supplied to mixer section 1 from power supply terminal 32 via choke coil 24. The bias voltages of transistors 8, 9, 10 and 11 of mixer section 1 and transistor 38 of amplifier 6 are obtained by dividing the power source voltage by resistors 25, 27 and 29. The voltage at the connecting point of resistors 25 and 27 is supplied to the control terminals of transistors 8, 9, 10 and 11 via resistor 26, and the voltage at the connecting point of resistors 27 and 29 is supplied to the control terminal of transistor 38 via resistor 28. The bias voltages are determined so that the conversion loss at the mixer section becomes minimum and the gain and distortion characteristics of the amplifier become optimum.

As above, by the third embodiment according to the present invention, considerable increase in AC operating current when the local oscillator signal is injected into the mixer section can be suppressed by operating the amplifier as the constant current circuit. Furthermore, since the same operating current is shared by the mixer section and the amplifier, current consumption of the overall apparatus can be reduced. The conversion gain of the frequency conversion apparatus can be improved by amplifying the high frequency input signal and intermediate frequency signal by same amplifier, thereby materializing the reduced noise figure of the overall apparatus.

Figure 8:
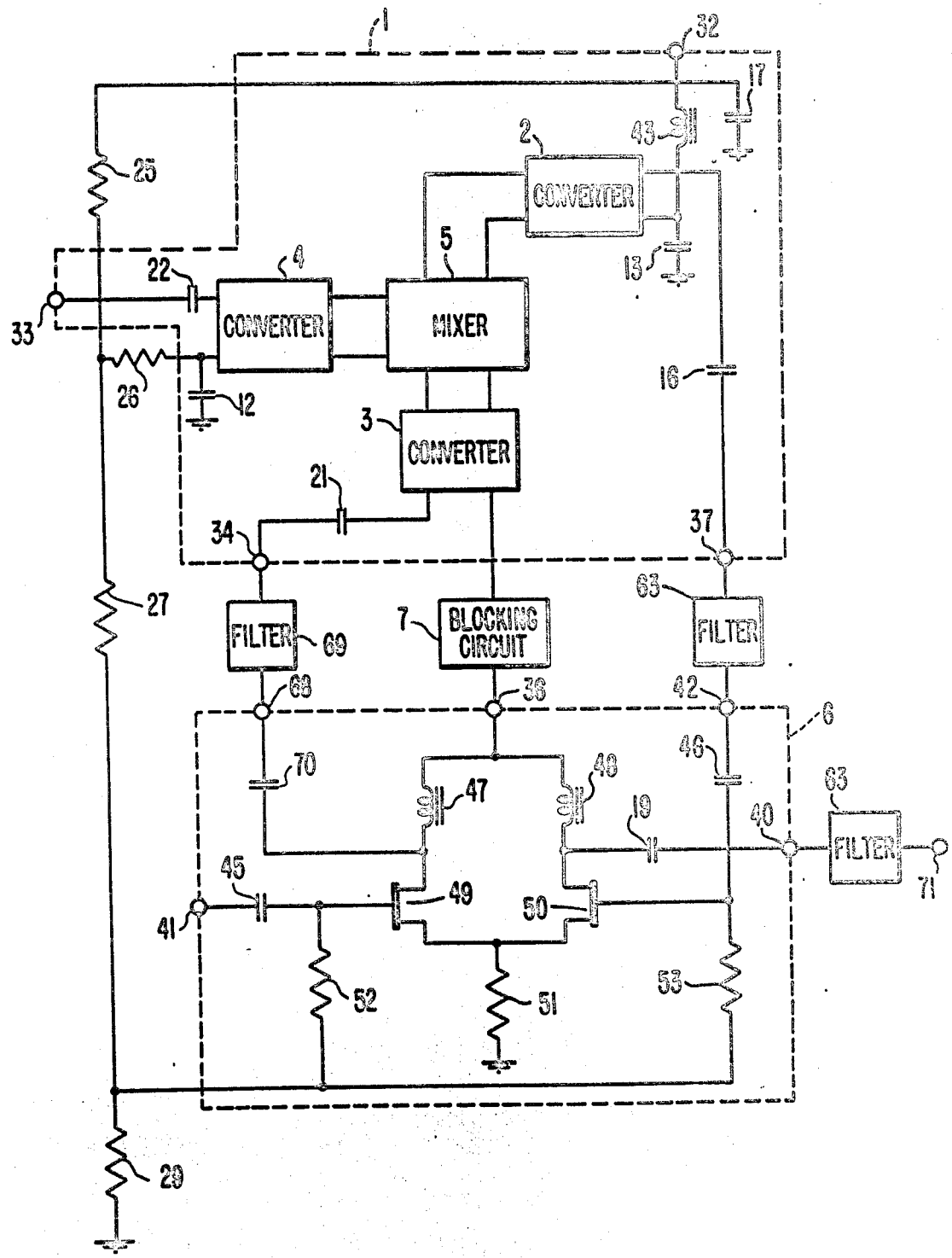
FIG. 8 is a circuit diagram of a frequency conversion apparatus according to the third embodiment, wherein the amplifier which operates as a constant current circuit is used as a 2-transistor high frequency input signal and intermediate frequency output signal amplifier.

Another embodiment based on the third embodiment acccording to the present invention will hereafter be explained by referring to FIG. 8.

In FIG. 8, detailed descriptions of balanced-to-unbalanced and unbalanced-to-balanced converters 2, 3, 4 and mixer section 1 are omitted because they are constructed and operated in the same way as described with respect to FIG. 7.

A high frequency input signal inputted to input terminal 41 of amplifier 6 passes through DC blocking capacitor 45, and enters into the control terminal of transistor 49. The amplifier 6 is a differential amplifier comprising transistors 49 and 50, main terminals of transistors 49 and 50 being interconnected and further connected to the ground via resistor 51.

The high frequency input signal at the control terminal of transistor 49 is amplified, taken out from the other main terminal of transistor 49, and outputted from output terminal 68 via DC blocking capacitor 70. The outputted high frequency input signal passes on input filter 69 to be removed of unnecessary band components, and is supplied to high frequency input terminal 34 of mixer section 1. The mixer section 1 mixes the high frequency input signal with the local oscillator signal, as described with respect to FIG. 7, and produces an intermediate frequency signal, which is taken out from intermediate frequency signal output terminal 37. The intermediate frequency signal passes through intermediate frequency filter 63, and enters into input terminal 42 of amplifier 6. After this, the signal is supplied via DC blocking capacitor 46 to the control terminal of transistor 50, amplified by transistor 50, taken out from the other main electrode, and outputted via DC blocking capacitor 19 and output terminal 40. At this time, since amplifier 6 is a differential amplifier, the high frequency input signal being amplified by transistor 49 also appears at output terminal 40. Accordingly, an intermediate frequency filter 63 is connected to output terminal 40 to remove the high frequency input signal, so that only the intermediate frequency signal is outputted from a terminal 71 to be supplied to the next stage. The other main terminals of transistors 49 and 50 are connected to power supply terminal 36 choke coils 47 and 48, respectively.

As described above, amplifier 6 is a differential amplifier comprised by transistors 49 and 50 and resistor 51, wherein transistor 49 amplifies the high frequency input signal while transistor 50 amplifies the intermediate frequency signal. However, the reverse thereof may be applied because transistors 49 and 50 are symmetrical.

The power supply terminal 36 is connected to unbalanced-to-balanced converter 3 via high frequency signal stopping circuit 7. The current flowing through mixer section 1 passes through high frequency signal blocking circuit 7 such that to be the high frequency signal is sufficiently attenuated and is supplied to amplifier 6. Therefore, the sum of currents flowing through the main terminals of transistors 49 and 50 is the very current of mixer section 1. The bias voltages of transistors 49 and 50 are determined so that the conversion loss of mixer section 1 becomes minimum and the gain and distortion characteristics of amplifier 6 becomes optimum. The bias voltages are supplied from the connecting point of resistors 27 and 29 to the control terminal of transistor 49 via resistor 52 and to the control terminal of transistor 50 via resistor 53.

Now, a further embodiment based on the third embodiment according to the present invention will be explained by referring to FIG. 9.

Figure 9:
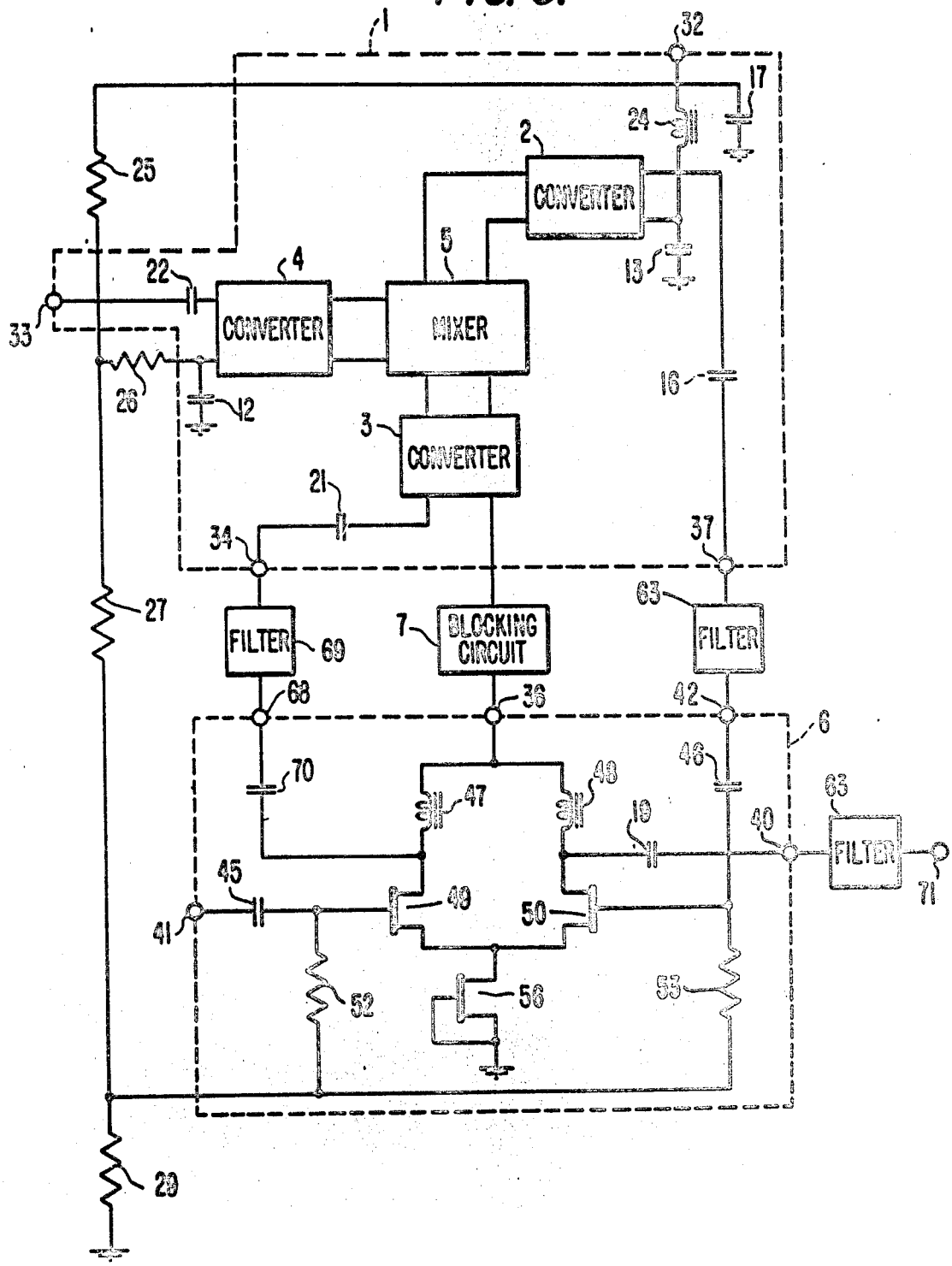
FIG. 9 is a circuit diagram of a frequency conversion apparatus according to the third embodiment, wherein the amplifier which operates as a constant current circuit is used as a 3-transistor high frequency input signal and intermediate frequency output signal amplifier.

Referring to FIG. 9, a transistor 56 is connected between the one main terminals of transistors 49 and 50 in amplifier 6 in place of resistor 51 in FIG. 8. The one main terminal of transistor 56 is connected with the control terminal of the same. The transistor 56 may be an enhancement type transistor or depletion type transistor.

Because the static characteristic of transistor 56 is utilized in connecting the control terminal and the one main terminal to be a constant current circuit, the operating current value is set by changing the static characteristic.

FIGS. 10, 11, 12 and 13 show other embodiments of the high frequency signal blocking circuit used in the frequency conversion apparatus according to the present invention.

Figure 10:
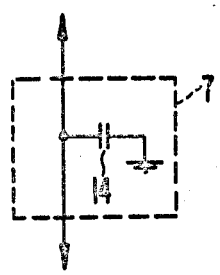
FIGS. 10, 11, 12 and 13 are circuit diagrams showing other embodiments of the high frequency signal stopping circuit.

FIG. 10 shows a configuration of high frequency signal blocking circuit 7, wherein mixer section 1 is directly connected with amplifier 6 and a grounding capacitor 14 is connected between the connecting point of mixer section 1 and amplifier 6. This configuration is the simplest configuration capable of attenuating the high frequency signal only by connecting the grounding capacitor 14 and is particularly advantageous for integrating the circuit.

Figure 11:
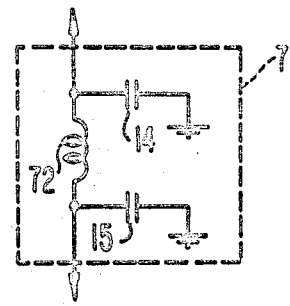

FIG. 11 shows a modified configuration of high frequency signal blocking circuit 7, wherein a coil 72 is used in place of resistor 31. When the resistor 31 is used, the direct current is consumed as heat generated by resistor 31 and the range of voltage supplied to mixer section 1 and amplifier 6 is narrowed by resistor 31 when the power source voltage is reduced. However, replacing resistor 31 with coil 72 can improve this problem considerably. Capacitors 14 and 15 are grounding capacitors. The values of coil 72 and capacitors 14 and 15 are selected to obtain the cut-off frequency which enables to sufficiently attenuate the unnecessary frequencies.

Figure 12:
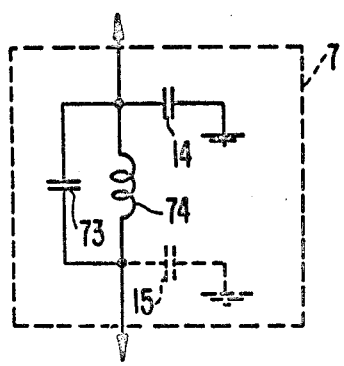

FIG. 12 shows another configuration of high frequency signal blocking circuit 7, wherein a parallel circuit of a coil 74 and a capacitor 73 replaces resistor 31. The coil 74 is used for passing direct current, and both ends of the high frequency signal blocking circuit 7 are grounded for high frequency signals by capacitor 73 and 14 or by capacitor 73 and 15. It is advantageous of this configuration, especially when integrating the circuit, that a signal grounding point may be provided, that the capacitance of capacitor 73 may be such a value as to sufficiently pass the desired frequency components, and that the parasitic capacity at coil 74 can be utilized to a greater extent in high frequency band.

Figure 13:
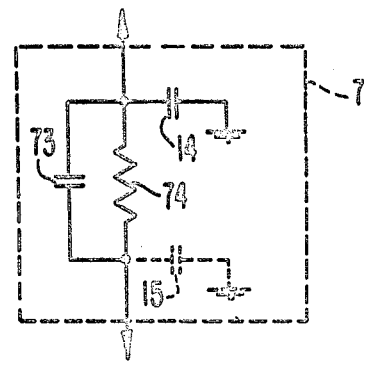

FIG. 13 shows a configuration wherein a resistor 31 replaces coil 74 in FIG. 12. The capacitors 14 and 15 are grounding capacitors and either one thereof may be used. With this configuration, it is advantageous, especially when integrating the circuit, that it is easier to form the resistor than to form the coil.

Figure 14:
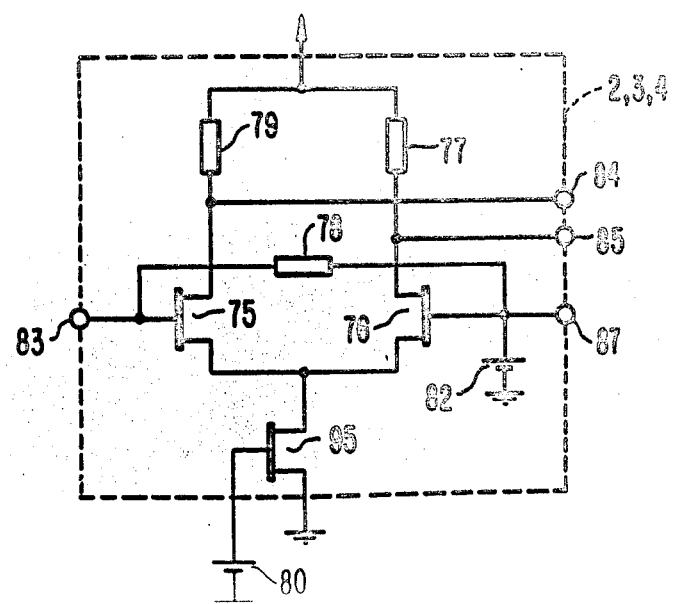
FIG. 14 is a circuit diagram of an embodiment of the unbalanced-to-balanced or balanced-to-unbalanced converter which is configured with 3 transistors.
Figure 15:
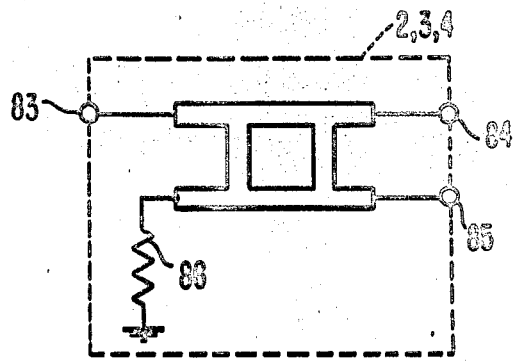
FIG. 15 is a circuit diagram of an embodiment of the unbalanced-to-balanced or balanced-to-unbalanced converter which is configured with a hybrid circuit.

FIGS. 14 and 15 illustrate other embodiments of the unblanced-to-balanced or balanced-to-unbalanced converter of the frequency conversion apparatus according to the present invention.

FIG. 14 shows a configuration wherein one main terminals of transistors 75 and 76 are interconnected and further to one main terminal of the transistor 95. The sum of the currents flowing through the main terminals of transistors 75 and 76 can be changed by varying a voltage of a DC bias voltage source 80 applied to the control terminal of transistor 95. A power is supplied to the other main terminals of transistors 75 and 76 via passive elements 79 and 77 such as resistors and choke coils. To convert balanced signals into an unbalanced signal, the balanced signals having opposite phases are inputted into terminals 83 and 87 so that the unbalanced signal is taken out from a terminal 84 or a terminal 85. To convert an unbalanced signal into balanced signals, the unbalanced signal is inputted into one of the terminals 83 and 87, and the other terminal into which the signal is not inputted is grounded with respect to high frequency signals so that the balanced signals are taken out from terminals 84 and 85. The bias voltages of transistors 75 and 76 are supplied to this control terminals from a DC bias voltage source 82. The control terminals of transistors 75 and 76 are connected via a passive element 78 such as a coil or resistor. Since this arrangement can be semiconductorized, the whole part of the frequency conversion apparatus can be semiconductorized as an integrated circuit and therefore small-sized. Furthermore, it is possible to obtain a gain because of the active element configuration.

FIG. 15 illustrates another configuration of the balanced-to-unbalanced or unbalanced-to-balanced converter which uses a hybrid circuit, wherein terminals 84 and 85 are for balanced signals and terminal 83 is for an unbalanced signal. The other side of the input/output terminal for the unbalanced signal of the hybrid circuit is terminated by a resistor 86. This configuration is suitable for super high frequency band and is advantageous for integrated-semiconductorization.

As is apparent from the above descriptions, each embodiment shown above has a configuration wherein an amplifier acts as a constant current source for a mixer section, but is independent as an intermediate frequency amplifier and/or a high frequency signal amplifier.

The effect of the invention will be described more specifically as to the amplifier which is operated as the intermediate frequency amplifier.

Figure 16:
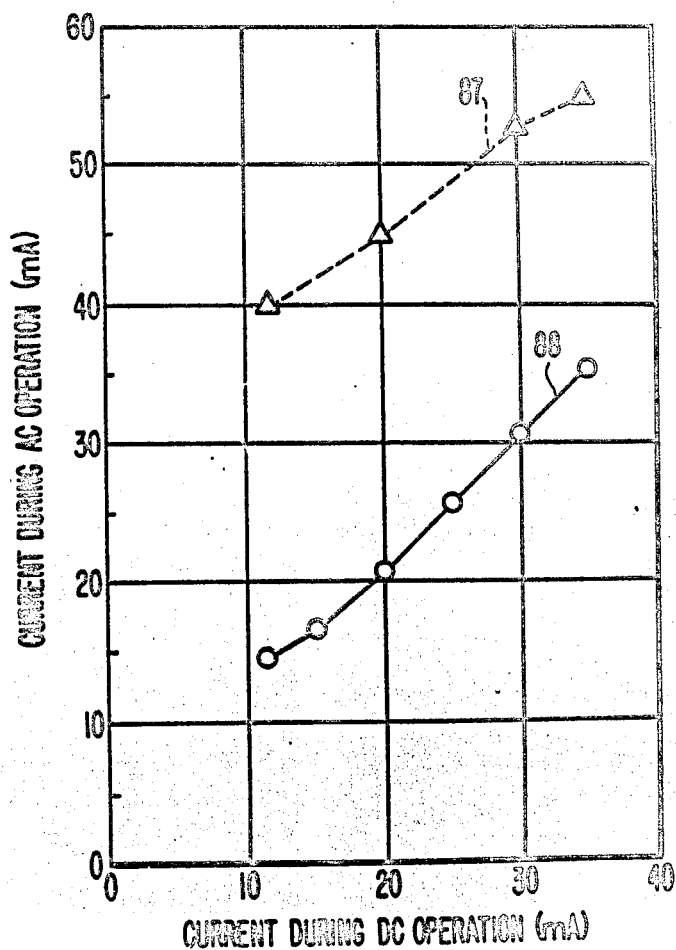
FIG. 16 is a characteristic diagram showing the relationship between currents during DC operation and AC operation with respect to a local oscillator signal input.

FIG. 16 is illustrative of the relation between the current during DC operation and the current during AC operation when the local oscillator signal power is 10 dBm. A curve 88 represents the case of the first embodiment according to the present invention, indicating that the increase in AC operating current is within 2 mA with respect to the DC operating current of over 20 mA. On the other hand, a curve 87 represents the case of the conventional apparatus, which indicates the increase in the AC operating current as high as 30 mA.

Figure 17:
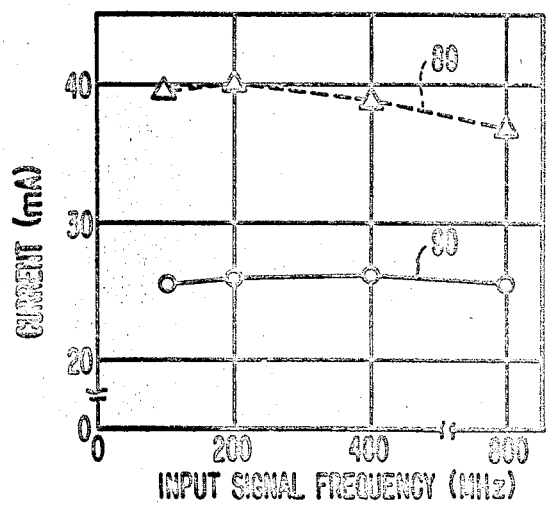
FIG. 17 is a characteristic diagram showing input signal frequency versus current with respect to local oscillator signal input.

Characteristic of the drain current of AC operation versus input signal frequency is as shown in FIG. 17, wherein a curve 90 is the case of the first embodiment with the DC operating current set to 25 mA, indicating the current during AC operation. In this case, maximum current of AC operation is 26.5 mA, representing an increase of only 1.5 mA. On the other hand, a curve 89 is the current during AC operation in the case of the conventional apparatus, in which the DC operating current is set to 4 mA. The current in the case of the conventional apparatus is increased by a maximum of 35 mA. Accordingly, the greater effect is achieved to reduce power consumption by the present invention.

Figure 18:
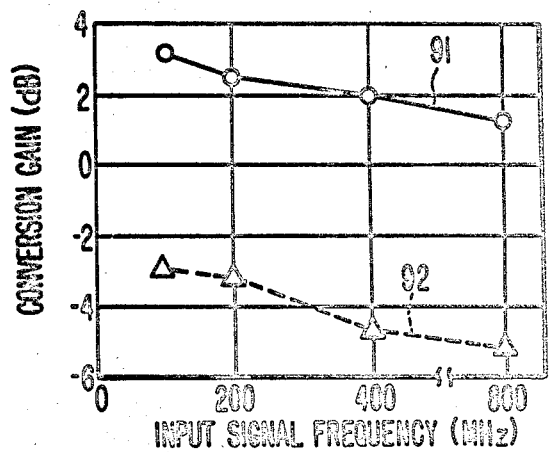
FIG. 18 is a characteristic diagram showing conversion gain with respect to input signal frequency.

Furthermore, as shown in FIG. 18, a curve 92 represents the conventional apparatus and a curve 91 the embodiment according to the present invention which shows higher conversion gain of 6.5 dB.

Figure 19:
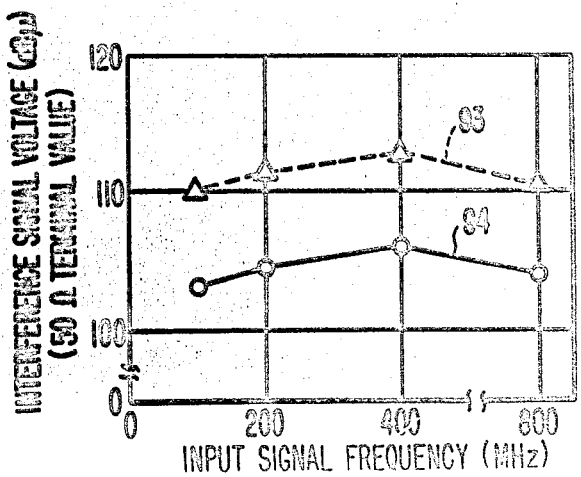
FIG. 19 is a characteristic diagram showing interference signal voltage with respect to input signal frequency.

As shown in FIG. 19, a curve 93 represents the conventional apparatus and a curve 94 the embodiment according to the present invention, indicating a deteriorated 1% cross modulation characteristic of 6.5 dB with respect to the former. However, an excellent effect is achieved in the case of 94, in which the disturbing signal voltage is over 103.5 dB (of 50 ohm terminal value).

What is claimed is:

1. A frequency conversion apparatus for converting a high frequency signal into an intermediate frequency signal, comprising:
    a mixing means for mixing said high frequency signal applied to its high frequency signal input terminal with a local oscillator signal applied to its local oscillator signal input terminal to thereby obtain said intermediate frequency signal at its intermediate frequency signal output terminal; and
    an amplifier connected at its output terminal to said mixing means via a high frequency signal blocking means for supplying a constant direct current to said mixing means;
    whereby a current flowing in said mixing means when said local oscillator signal is applied to said local oscillator signal input terminal is kept substantially equal to a direct current flowing in said mixing means when no signal is applied to said local oscillator signal input terminal, while said amplifier acts as an AC signal amplifier independently of said mixing means.

2. An apparatus according to claim 1, wherein said mixing means comprises: a double balanced mixer for mixing balanced local oscillator signals applied to its two local oscillator signal input terminals with balanced high frequency signals applied to its two high frequency signal input terminals to thereby obtain balanced intermediate frequency signals at its two intermediate frequency signal output terminals; a first unbalanced-to-balanced converter for converting said local oscillator signal to said balanced local oscillator signals; a second unbalanced-to-balanced converter for converting said high frequency signal to said balanced high frequency signals; and a balanced-to-unbalanced converter for converting said balanced intermediate frequency signals to said intermediate frequency signal.

3. A frequency conversion apparatus for converting a high frequency signal into an intermediate frequency signal, comprising:
    a mixing means for mixing said high frequency signal applied to its high frequency signal input terminal with a local oscillator signal applied to its local oscillator signal input terminal to thereby obtain said intermediate frequency signal; and
    an amplifier connected at its output terminal to said mixing means via a high frequency signal blocking means for supplying a constant direct current to said mixing means, said amplifier amplifying said intermediate frequency signal;
    whereby a current flowing in said mixing means when said local oscillator signal is applied to said local oscillator signal input terminal is kept substantially equal to a direct current flowing in said mixing means when no signal is applied to said local oscillator signal input terminal, while said amplifier acts as an AC signal amplifier independently of said mixing means.

4. An apparatus according to claim 3, wherein said mixing means comprises: a double balanced mixer for mixing balanced local oscillator signals applied to its two local oscillator signal input terminals with balanced high frequency signals applied to its two high frequency signal input terminals to thereby obtain balanced intermediate frequency signals at its two intermediate frequency signal output terminals; a first unbalanced-to-balanced converter for converting said local oscillator signal to said balanced local oscillator signals; a second unbalanced-to-balanced converter for converting said high frequency signal to said balanced high frequency signals; and a balanced-to-unbalanced converter for converting said balanced intermediate frequency signals to said intermediate frequency signal.

5. An apparatus according to claim 4, wherein said amplifier is a differential amplifier for amplifying said balanced intermediate frequency signal applied to its two input terminals to obtain an ampified intermediate frequency signal at one of its two output terminals which are connected in common to said output terminal of said amplifier.

6. An apparatus according to claim 3, wherein said amplifier comprises a single transistor for amplifying said intermediate frequency signal applied to its input terminal so as to obtain an amplified intermediate frequency signal at its output terminal which is connected to said output terminal of said amplifier.

7. A frequency conversion apparatus for converting a high frequency signal into an intermediate frequency signal, comprising:
a mixing means for mixing said high frequency signal applied to its high frequency signal input terminal with a local oscillator signal applied to its local oscillator signal input terminal to thereby obtain said intermediate frequency signal at its intermediate frequency signal output terminal; and
an amplifier connected at its output terminal to said mixing means via a high frequency signal blocking means for supplying a constant direct current to said mixing means, said amplifier amplifying an input high frequency signal so as to obtain said high frequency signal applied to said high frequency signal input terminal of said mixing means;
whereby a current flowing in said mixing means when said local oscillator signal is applied to said local oscillator signal input terminal is kept substantially equal to a direct current flowing in said mixing means when no signal is applied to said local oscillator signal input terminal, while said amplifier acts as an AC signal amplifier independently of said mixing means.

8. An apparatus according to claim 7, wherein said mixing means comprises: a double balanced mixer for mixing balanced local oscillator signals applied to its two local oscillator signal input terminals with balanced high frequency signals applied to its two high frequency signal input terminals to thereby obtain balanced intermediate frequency signals at its two intermediate frequency signal output terminals; a first unbalanced-to-balanced converter for converting said local oscillator signal to said balanced local oscillator signals; a second unbalanced-to-balanced converter for converting said high frequency signal to said balanced high frequency signals; and a balanced-to-unbalanced converter for converting said balanced intermediate frequency signals to said intermediate frequency signal.

9. An apparatus according to claim 7, wherein said amplifier comprises a single transistor for amplifying said input high frequency signal applied to its input terminal so as to obtain an amplified high frequency signal which is said high frequency signal at its output terminal which is connected to said output terminal of said amplifier and to said high frequency signal input terminal of said mixing means via a direct current stopping element.

10. An apparatus according to claim 7, wherein said amplifier is a differential amplifier for amplifying said input high frequency signal applied to one of its two input terminals to obtain an amplified high frequency signal which is said high frequency signal applied to said high frequency signal input terminal of said mixing means at one of its two output terminals which are connected in common to said output terminal of said amplifier.

11. A frequency conversion apparatus for converting a high frequency signal into an intermediate frequency signal, comprising:
a mixing means for mixing said high frequency signal applied to its high frequency signal input terminal with a local oscillator signal applied to its local oscillator signal input terminal to thereby obtain said intermediate frequency signal; and
an amplifier connected at its output terminal to said mixing means via a high frequency signal blocking means for supplying a constant direct current to said mixing means, said amplifier amplifying both an input high frequency signal and said intermediate frequency signal at the same time so as to obtain an amplified intermediate frequency signal and an amplified input high frequency signal which is said high frequency signal applied to said high frequency signal input terminal of said mixing means;
whereby a current flowing in said mixing means when said local oscillator signal is applied to said local oscillator signal input terminal is kept substantially equal to a direct current flowing in said mixing means when no signal is applied to said local oscillator signal input terminal, while said amplifier acts as an AC signal amplifier independently of said mixing means.

12. An apparatus according to claim 11, wherein said mixing means comprises: a double balanced mixer for mixing balanced local oscillator signals applied to its two local oscillator signal input terminals with balanced high frequency signals applied to its two high frequency signal input terminals to thereby obtain balanced intermediate frequency signals at its two intermediate frequency signal output terminals; a first unbalanced-to-balanced converter for converting said local oscillator signal to said balanced local oscillator signals; a second unbalanced-to-balanced converter for converting said high frequency signal to said balanced high frequency signals; and a balanced-to-unbalanced converter for converting said balanced intermediate signals to said intermediate frequency signal.

13. An apparatus according to claim 11, wherein said amplifier comprises a single transistor for amplifying said input high frequency signal and said intermediate frequency signal which are applied to its input terminal so as to obtain said amplified input high frequency signal and said amplified intermediate frequency signal at its output terminal which is connected to said output terminal of said amplifier and to said high frequency signal input terminal of said mixing means via a direct current stopping element.

14. An apparatus according to claim 13, further comprising a filter connected to said output terminal of said amplifier for separating said amplified input high frequency signal and said amplified intermediate frequency signal.

15. An apparatus according to claim 11, wherein said amplifier is a differential amplifier for amplifying said input high frequency signal and said intermediate frequency signal which are applied to its two input terminals, respectively, so as to obtain said amplified input high frequency signal and said amplified intermediate frequency signal at its two output terminals which are connected in common to said output terminal of said amplifier.

16. An apparatus accordng to claim 15, further comprising a first filter connected to one of said two output terminals of said differential amplifier for suppressing said amplified intermediate frequency signal so as to apply only said amplified input high frequency signal to said high frequency signal input terminal of said mixing means, and a second filter connected to the other of said two output terminals of said differential amplifier for suppressing said amplified input high frequency signal so as to obtain only said amplified intermediate frequency signal as an output signal of said apparatus.

* * * * *